(12) United States Patent
Sofer et al.

(10) Patent No.: US 10,746,795 B2
(45) Date of Patent: Aug. 18, 2020

(54) METHOD AND APPARATUS FOR AT-SPEED SCAN SHIFT FREQUENCY TEST OPTIMIZATION

(71) Applicants: Sergey Sofer, Rishon Lezion (IL); Asher Berkovitz, Kityat Ono (IL); Michael Priel, Netanya (IL)

(72) Inventors: Sergey Sofer, Rishon Lezion (IL); Asher Berkovitz, Kityat Ono (IL); Michael Priel, Netanya (IL)

(73) Assignee: NXP USA, Inc., Austin, TX (US)

( * ) Notice: Subject to any disclaimer, the term of this patent is extended or adjusted under 35 U.S.C. 154(b) by 158 days.

(21) Appl. No.: 14/438,234

(22) PCT Filed: Oct. 30, 2012

(86) PCT No.: PCT/IB2012/056019
§ 371 (c)(1),
(2) Date: Apr. 24, 2015

(87) PCT Pub. No.: WO2014/068368
PCT Pub. Date: May 8, 2014

(65) Prior Publication Data
US 2015/0276869 A1 Oct. 1, 2015

(51) Int. Cl.
*G01R 31/3177* (2006.01)
*G01R 31/3185* (2006.01)
*G01R 31/28* (2006.01)

(52) U.S. Cl.
CPC . *G01R 31/3177* (2013.01); *G01R 31/318536* (2013.01); *G01R 31/318575* (2013.01);
(Continued)

(58) Field of Classification Search
CPC ............ G01R 31/2851; G01R 31/3177; G01R 31/318536; G01R 31/318575; G01R 31/318577; G01R 31/318594
See application file for complete search history.

(56) References Cited

U.S. PATENT DOCUMENTS 5,664,122 A * 9/1997 Rabe .................. G06F 13/4059
710/307
5,673,396 A * 9/1997 Smolansky ........... G06F 9/3879
710/307

(Continued)

OTHER PUBLICATIONS

International Search Report and Written Opinion correlating to PCT/IB2012/056019 dated Apr. 30, 2013.

(Continued)

*Primary Examiner* — April Y Blair
*Assistant Examiner* — Sazzad Hossain

(57) ABSTRACT

There is provided an integrated circuit comprising at least one logic path, comprising a plurality of sequential logic elements operably coupled into a scan chain to form at least one scan chain under test, at least one IR drop sensor operably coupled to the integrated circuit power supply, operable to output a first logic state when a sensed supply voltage is below a first predefined value and to output a second logic state when the sensed supply voltage is above the first predefined value, at least one memory buffer operably coupled to a scan test data load-in input and a scan test data output of the at least one scan chain under test, and control logic operable to gate logic activity including the scan shift operation inside the integrated circuit for a single cycle when the at least one IR drop sensor outputs the first logic state and to allow normal scan test flow when the at least one IR drop sensor outputs the second logic state. There is also provided an associated method of performing at-speed scan testing of an integrated circuit.

18 Claims, 6 Drawing Sheets

(52) U.S. Cl.
CPC ......... *G01R 31/318577* (2013.01); *G01R 31/318594* (2013.01); *G01R 31/2851* (2013.01)

(56) References Cited

U.S. PATENT DOCUMENTS

| | | | |
|---|---|---|---|
| 7,036,029 B2 | 4/2006 | May et al. | |
| 7,516,379 B2 | 4/2009 | Rohrbaugh et al. | |
| 2003/0084390 A1 | 5/2003 | Tamarapalli et al. | |
| 2004/0158422 A1 | 8/2004 | Brown et al. | |
| 2004/0183581 A1* | 9/2004 | Yasui | G01R 31/31859 327/215 |
| 2004/0218454 A1* | 11/2004 | Gorman | G11C 29/802 365/225.7 |
| 2005/0097420 A1 | 5/2005 | Frisch et al. | |
| 2005/0149799 A1* | 7/2005 | Hemia | G01R 31/3008 714/726 |
| 2005/0278593 A1* | 12/2005 | Muradali | G01R 31/31858 714/724 |
| 2007/0150780 A1* | 6/2007 | Shimooka | G06F 1/3203 714/726 |
| 2008/0133989 A1* | 6/2008 | Hayashi | G01R 31/31853 714/726 |
| 2010/0180169 A1* | 7/2010 | La Fever | G01B 31/31853 714/727 |
| 2010/0269004 A1* | 10/2010 | Flynn | G06F 11/10 714/746 |
| 2011/0001555 A1* | 1/2011 | Luzzi | G05F 3/30 327/539 |
| 2012/0001669 A1* | 1/2012 | Salling | H03K 3/012 327/218 |
| 2013/0099825 A1* | 4/2013 | Cheng | H03K 5/2472 327/65 |

OTHER PUBLICATIONS

Synopsys's whitepaper: "Testing Low Power Designs with Power-Aware Test", Manage Manufacturing Test Power Issues with DFTMAX and TetraMAX, Apr. 2010, pp. 1-5.

Nabil Badereddine et al: "Minimizing Peak Power Consumption during Scan Testing: Test Pattern Modification with X Filling Heuristics", Design and Test of Integrated Systems in Nanoscale Technology, International Conference, Sep. 5-7, 2006, pp. 359-364.

Open-Silicon, "TestMAX Lowest Test Costs", webpage: http://www.open-silicon.com/max-technology/#testmax.

Xijiang Lin et al, "Scan Shift Power Reduction by Freezing Power Sensitive Scan Cells", Journal of Electronic Testing , vol. 24, No. 4, pp. 327-334.

A. Ramachandran: "Dynamic Shift Frequency Scaling of ATPG Patterns", Open-Silicon Research Pvt Ltd., Snug India 2007, pp. 1-27.

Tessent TestKompress: "ATPG with Embedded Compression", Silicon Test Yield Analysis Datasheet, Mentor Graphics, 2011, pp. 1-2.

* cited by examiner

METHOD AND APPARATUS FOR AT-SPEED SCAN SHIFT FREQUENCY TEST OPTIMIZATION

FIELD OF THE INVENTION

This invention relates to the field of integrated circuit (IC) test and verification, and in particular, to a method and apparatus for at-speed scan shift frequency test optimization.

BACKGROUND OF THE INVENTION

Due to improvements in integrated circuit manufacturing capabilities, and to satisfy demand for increased integrated circuit usability and capability, such as the demand for increased functionality whilst preserving or improving on integrated circuit power requirements, integrated circuits are getting more and more complex over time. As with any product, these increased complexity ICs need testing to identify and eliminate errors and defects before and during mass production, or to just fully ascertain the functional capabilities of the integrated circuits prior to the product release, such as operating frequency.

Product testing for complex integrated circuits usually involves multiple test methods. For example, the scan-based automatic test pattern generation (ATPG) model for determining any 'stuck-at' fault(s) has been a standard test methodology for many years, but the fact that many ICs under test pass high coverage 'stuck-at' fault tests, but still fail to operate in normal conditions has led to the development of new, additional, test methodologies.

An example is the 'at-speed (scan) test' methodology, which is a form of integrated circuit testing that analyses integrated circuit operation to look for integrated circuit defects that result in speed or timing problems, such as crosstalk errors, path delay, and the like. These are particularly a problem at the more recent small manufacturing process nodes (e.g. 90 nm and smaller processes) now commonly used to manufacture integrated circuits, where the percentage of timing related defects is so high that static testing is no longer considered sufficient. At-speed scan testing, may be particularly associated with System on Chip (SoC) designs due to their increased complexity and therefore higher susceptibility to the causes of integrated circuit failure.

At-speed scan testing of integrated circuit designs typically has two portions. A first shift load-in data portion that is carried out at relatively low frequency, to load the test data patterns into the Integrated circuit under test, or portion thereof (e.g. scan chain). Then, a second portion comprising the integrated circuit being tested using this loaded in test data at a relatively high frequency (for example, at least at an intended operational frequency of the integrated circuit under test, but usually higher, in order to "push" the integrated circuit). The two portions may be carried out alternately with one another, with different test data patterns being loaded in in different shift load-in portions.

During at-speed scan testing of a particular integrated circuit under test, the current drawn by (or related power consumption of) the integrated circuit may be measured—and used to help determine if the integrated circuit has passed or failed the respective test.

Thus, at-speed scan testing of ICs involves, amongst other things, inputting test patterns to test for correct integrated circuit operation during normal use at high application frequencies, to thereby identify any erroneous operation, including excessive power use, due to issues such as outright mis-design of the integrated circuit, wire delay, crosstalk, and the like. These at-speed scan tests can also help determine a maximum safe operating frequency for a particular integrated circuit. Thus, at-speed scan testing not only occurs at the intended operating frequency of an integrated circuit, but also helps to determine what that intended operating frequency should be.

SUMMARY OF THE INVENTION

The present invention provides an integrated circuit and method of performing at-speed scan testing of an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
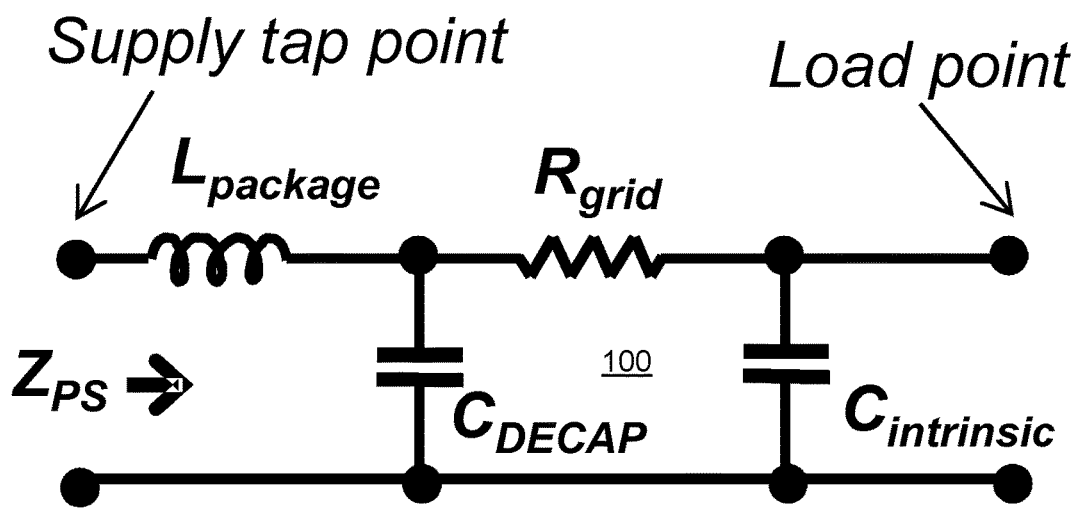
FIG. 1 schematically shows an example simplified model representation of an integrated circuit power supply power distribution network.

All integrated circuits use a power supply, with the power supply typically being connected to the various parts of the integrated circuit needing power through a power distribution network. Conventionally a power distribution network (PDN) of an integrated circuit is characterized by its impedance. An example is shown in FIG. 1, which shows a simplified model representation of such a power distribution network. The simplified power distribution network model 100 may be viewed as comprising, between a supply tap point and output (load point), a package inductance ($L_{package}$) in series with a power supply resistance ($R_{grid}$), with a decoupling capacitance ($C_{decap}$) and intrinsic parasitic capacitance ($C_{intrinsic}$) coupling respective points down to ground/0 v. These interconnected resistances, capacitances and inductances result in an observed (by the power supply) total impedance of $Z_{ps}$.

By their nature, such power supply power distribution networks exhibit a voltage droop comprising an IR drop (where I is current and R is resistance and L×dI/dt drop where L is the inductance and dI/dt is the change in current consumption of the loading circuit) when being driven at high frequency, which may result in incorrect operation due to increased delay or outright incorrect voltage levels. For example, a nominal "high" voltage (sufficient for circuit operation) may drop to such an extent that it ends up being seen as a "low" voltage (insufficient for the circuit operation). Hereafter and for the sake of simplicity the effect of power supply level descent or ground voltage elevation will be referred to by the term IR drop regardless of the real nature of this effect: passive power distribution network resistance or complex power distribution network impedance. This problem can be exacerbated in some integrated circuits where they use more than one power supply.

The essence of the at-speed scan test is in initializing flip-flops of the portion of the integrated circuit under test, i.e. scan chain, with predefined test pattern values, for example, by "shifting" the data into the integrated circuit via special wires with a (relatively) "slow" clock (referred to below as a shift load-in of the scan test data). Then, the integrated circuit is operated at normal (or even raised) clock frequency, for a few (e.g. up to 4) "fast" clock cycles, to capture operation of the integrated circuit under test at normal (or higher than normal) operating frequency using that shifted in test data. This allows real circuit electrical paths testing.

The current drawn during the different portions of this test can be used as a factor to determine whether a particular integrated circuit is considered to be operating normally, or not. Too much current draw in a particular section may be regarded as a failure of the integrated circuit. As may be appreciated, the current drawn by the integrated circuit, or part thereof, is proportional to the IR drop experienced.

Figure 2:
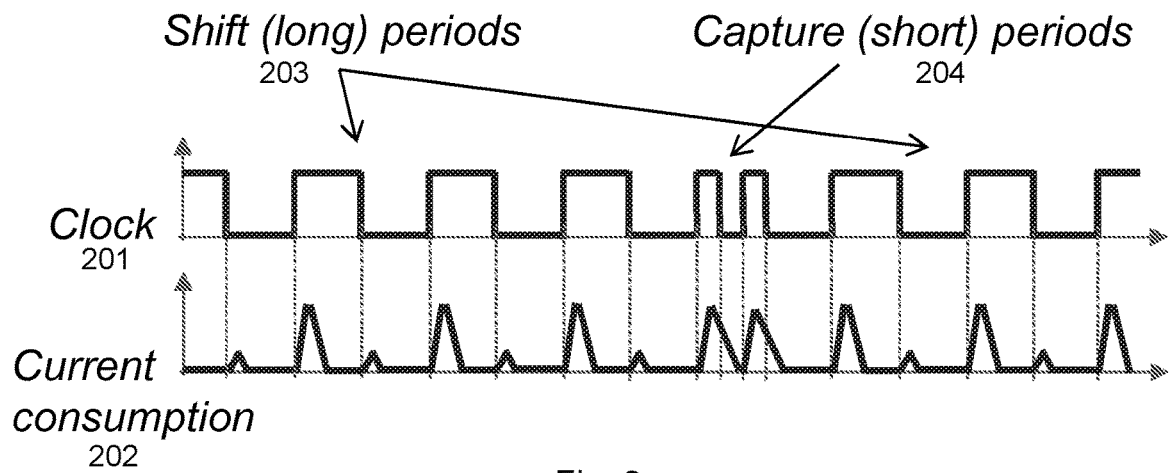
FIG. 2 shows an example set of graphs showing current consumption of an integrated circuit under test during different portions, shift or capture, of an at-speed scan test.

FIG. 2 exemplifies these two different portions/periods of the at-speed scan test process. In particular, this figure shows an example integrated circuit clocking graph 201 compared to current consumption 202 by the same integrated circuit during the respective "fast" and "slow" portions of the clocking graph. There are clearly shown two 'slow' shift load-in portions 203 and a (relatively) faster output test data capture period 204 in between.

Conventionally, during any operation of an integrated circuit, the switching activity of cells forming the integrated circuit, (e.g. individual transistors and the like, that effectively defines "operation") will cause current draw to occur. The level of this current draw may be dependent on many factors, including but not limited to transaction level, cross talk, etc.

Whilst high current draw during the faster test capture periods is one factor to determine whether an integrated circuit under test is operating within predetermined bounds defining the 'fail' or 'pass' of the integrated circuit under test, and some considerable effort is made to reduce this sort of power consumption during the integrated circuit design stage, it is also the case that the current drawn during the load-in period can be a factor in determining the existence or extent of failure of an integrated circuit under test. However, conventionally, it is also simply assumed that the supply current when drawn during the low frequency shift cycles is insignificant or at least does not cause the circuit failure.

Higher switching activity of an integrated circuit can cause it to draw higher peak supply currents, which may result in higher power dissipation. This is accounted for in the at-speed testing, by measuring the current draw during use, and deeming any Integrated circuit under test exhibiting too high a current draw during the test to be a failure.

However, this does not take into account the fact that integrated circuits are not designed for optimal operation during the shift load-in of the test patterns themselves. This is to say, the 'load-in' of the at-speed test patterns is not typically aligned with the normal operation of the integrated circuit under test, so there is little or no reason to optimise the integrated circuit for the test pattern load. To do so would waste time and integrated circuit resources on only a very little used part of the overall integrated circuit. Furthermore, the test patterns are purposefully designed to be taxing on the integrated circuit—for example maximising the number of transactions carried out between different portions of the integrated circuit, or the like, to thereby exhibit worst case scenarios of current draw and the like.

Moreover, the (relatively) low speed test pattern load-in frequency is actually the major time factor in setting the overall at-speed scan product test time, because, the lower the slow test pattern input frequency, the slower the overall test.

These increased gate delays during at-speed testing, especially during the load-in portion (that is typically assumed to be irrelevant, but in fact is not), may cause otherwise good ICs to artificially fail the at-speed tests, causing unnecessary yield loss (so called false failures), because an IC test engineer may try to increase the (relatively) slow shift load-in portion, to speed up the overall test, but then observe too much current being drawn by the integrated circuit, and hence deem the integrated circuit as a (false) failure.

However, designing test shift patterns (and/or test paths) to be suitable for use with higher shift load-in frequencies can result in the need for bigger timing margins, increased integrated circuit power, area and/or complexity, all only for the purpose of test, and not the subsequent operational lifetime of the integrated circuit.

This problem is particularly notable when the integrated circuit under test involves isolated power domains or any other low power arrangements, because they can encounter higher perceived yield loss (i.e. they fail the test), due to extremely high IR drops caused by excessive current during the shifts.

Figure 3:
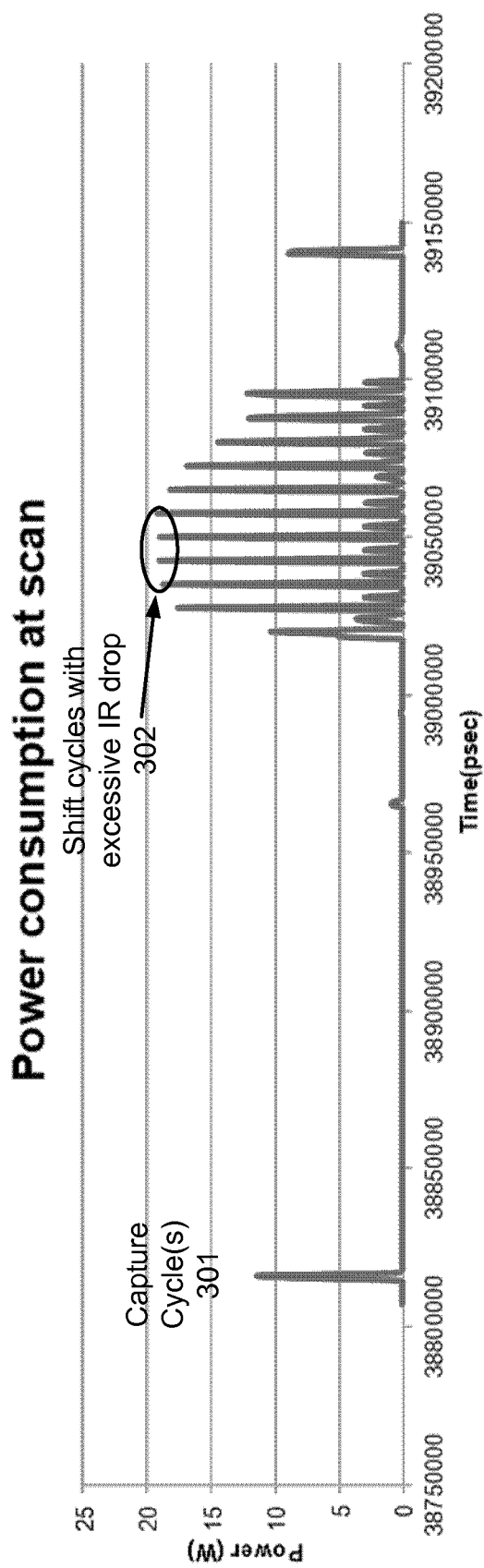
FIG. 3 shows a more detailed graph of power consumption of an integrated circuit during at-speed scan testing of the integrated circuit.

This problem is particularly illustrated in FIG. 3, which shows an example integrated circuit power consumption graph showing a relatively low power surge (indicating higher integrated circuit current draw) when the fast capture period is carried out 301 (from a previous slow load in portion, not shown), compared to the relatively much higher 'load-in' power draw when the test data is loaded in 302.

Ignoring this issue to date has resulted in either slower integrated circuit at-speed tests, or artificially high false failures of the tested integrated circuits where load-in speed was elevated without mitigation techniques in place.

Accordingly, examples of the invention provide an improved at-speed scan test method and apparatus by providing the integrated circuit under test with an IR drop measurement device, so that during shift load-in of the at-speed test data patterns, any resultant IR drop may be measured, and when the IR drop becomes excessive, mitigation procedures can be applied to the shift load-in portion of the at-speed scan test. For example, when excessive IR drop is detected, the clocking signal may have dummy shift cycles inserted by gating all the activity of the integrated circuit on-die, thereby extending the effective length of each specific load-in clock signal cycle, which in turn effectively drops the frequency of the load-in portion for only that cycle (or a few thereafter, if the methodology is applied multiple times) when the act of shift load-in of the test data is causing otherwise too great an IR drop.

In general terms there is therefore provided an integrated circuit comprising at least one logic path, comprising a plurality of sequential logic elements operably coupled into a scan chain to form at least one scan chain under test, at least one IR drop sensor operably coupled to the integrated circuit power supply, operable to output a first logic state when a sensed supply voltage is below a first predefined value and to output a second logic state when the sensed supply voltage is above the first predefined value, at least one memory buffer operably coupled to a scan test data load-in input and a scan test data output of the at least one scan chain under test, and control logic operable to gate logic activity including the scan shift operation inside the integrated circuit for a single cycle when the at least one IR drop sensor outputs the first logic state and to allow normal scan test flow when the at least one IR drop sensor outputs the second logic state.

A majority of the IR drop may occur within the integrated circuit package itself, therefore, the sensed supply voltage may be a global supply voltage for the whole integrated circuit or a local supply voltage for the relevant portion of the integrated circuit only, for example a local supply voltage for the scan chain under test or a logic cloud group containing the scan chain under test.

The scan test data output may be considered push-out data, i.e. the resultant test data pushed out of the output of the scan chain under test, as a result of processing the loaded-in test data.

The internal gating of the logic activity may include gating the scan shift operation inside the integrated circuit (or relevant sub portion thereof, such as the at least one scan chain(s) under test, or logic cloud containing the one or more scan chains under test) for only a single cycle, or more than one cycle, depending on the implementation. The word inside is used to indicate that examples suppress the current drawn during load-in of the scan test data, to prevent the IR drop that would otherwise occur, in order to bring the internal supply voltage to back to within desired levels (which in this example may mean, to be above the predetermined threshold level). Examples may further comprise specifically gating the logic activity only within the logic cloud containing the at least one scan chain under test, or only within the scan chain under test itself. Internal gating may be alternately viewed as switching off the input clock to the scan chain for a short period of time (such as a single cycle length), and hence preventing further logic changes in the scan chain. At the same time, the memory buffer will be made operational to collect the incoming test data, which would otherwise be lost if not being received by the scan chain.

Allowing normal scan test flow means allowing (by suitable gating) scan test data load-in to proceed 'as normal', i.e. according to the normal operating frequency of the shift load-in portion of the scan test and not extending any shift cycle's length, to thereby provide the input to the test scan data registers of the scan chain under test to load-in the scan test data. In some examples, the IR drop sensor may be located in proximity to the at least one scan chain under test or at a location with a highest expected IR drop during load-in of the scan test data into the integrated circuit. The expected highest IR drop location may be determined during an iterative application of the method, by testing on suitable example test case ICs, or through suitable computer modelling/simulation of the relevant, or similar integrated circuit designs, or the like.

The IR drop sensor will have a related latency (i.e. time to provide a measurement output), and accordingly, the IR drop sensor may be formed to have a latency value low enough to allow the IR drop sensor to sense an IR drop and provide a logic output in time for the next shift data load-in cycle. This means the latency of the IR drop sensor may be related to the expected (or highest intended) operating frequency during the at-speed scan test.

The memory buffer may be a First-In-First-Out (FIFO) buffer, or at least a memory buffer that is functionally equivalent. The invention is not limited, in the genial sense, by the form the memory buffers takes, for example the total storage capacity provided and layout (e.g. depth and/or width) of the memory buffer. The lay out may be dependent on a number of factors, such as, but not limited to, the particular use case, and may be set to be a particular minimum size, e.g. from a single word depth and up, or may be functionally defined in relation to the size of other data carrying or storing entities within the overall integrated circuit under test, such as for example, the width of the test data bus width, or the number of logical units, (or related shift register entities) in use or being tested.

For example, the memory buffer may have a depth equal to at least half the length of a maximum intended length of scan chain, up to the maximum intended length of the scan test chain, where the length of scan chain may comprises the number of units in the scan chain under test or the length of the scan test data shift register operable to provide the scan test data to the respective parts of the scan test chain after receipt from the load-in.

The memory buffer may be operable to hold a next portion of the load-in data when the IR drop sensor outputs the first logic state and to immediately release the next portion of the load-in data in the next cycle when the IR drop sensor outputs the second logic state.

Similarly, the memory buffer may be further operable to hold a next portion of output test data (i.e. the data output from the integrated circuit under test as a result of carrying out the processes resultant from the following the inputted test data) when the IR drop sensor outputs the first logic state and to immediately release the next portion of the output test data in the next cycle when the IR drop sensor outputs the second logic state.

In some examples, the control logic may be further operable to provide an output signal indicative of the operational status of the memory buffer to indicate a current status of the at-speed test of the integrated circuit to a test engineer, i.e. indicating that the shift load-in cycle extension is occurring at that moment in time.

Corresponding to the generalised apparatus (i.e. integrated circuit) discussed above, there is also provided a method of performing at-speed scan testing of an integrated circuit, comprising receiving test data at an input to at least one scan chain under test of an integrated circuit, measuring a supply voltage with at least one IR drop sensor coupled to the integrated circuit power supply whilst receiving the test data, outputting a first logic state when a sensed supply voltage is below a first predefined value and outputting a second logic state when the sensed supply voltage is above the first predefined value, gating logic activity including the scan shift operation inside the integrated circuit for a single cycle when the at least one IR drop sensor outputs the first logic state or allowing normal scan test flow when the at least one IR drop sensor outputs the second logic state, wherein if gating of logic activity occurs, the method further comprises storing incoming test data in a memory buffer for at least one test shift cycle.

Examples of the method may further comprise the scan chain under test receiving, from the memory buffer, the previously stored incoming test data delayed by at least one cycle, or for an integer multiple of a single test clock cycle, where the delay implemented in more than a single test clock cycle.

Examples also provide tangible computer readable media comprising instructions which when carried out by a processor causes the processor and any associated hardware to carry out the described example methods.

There now follows a description of a specific example of the disclosed method.

Figure 4:
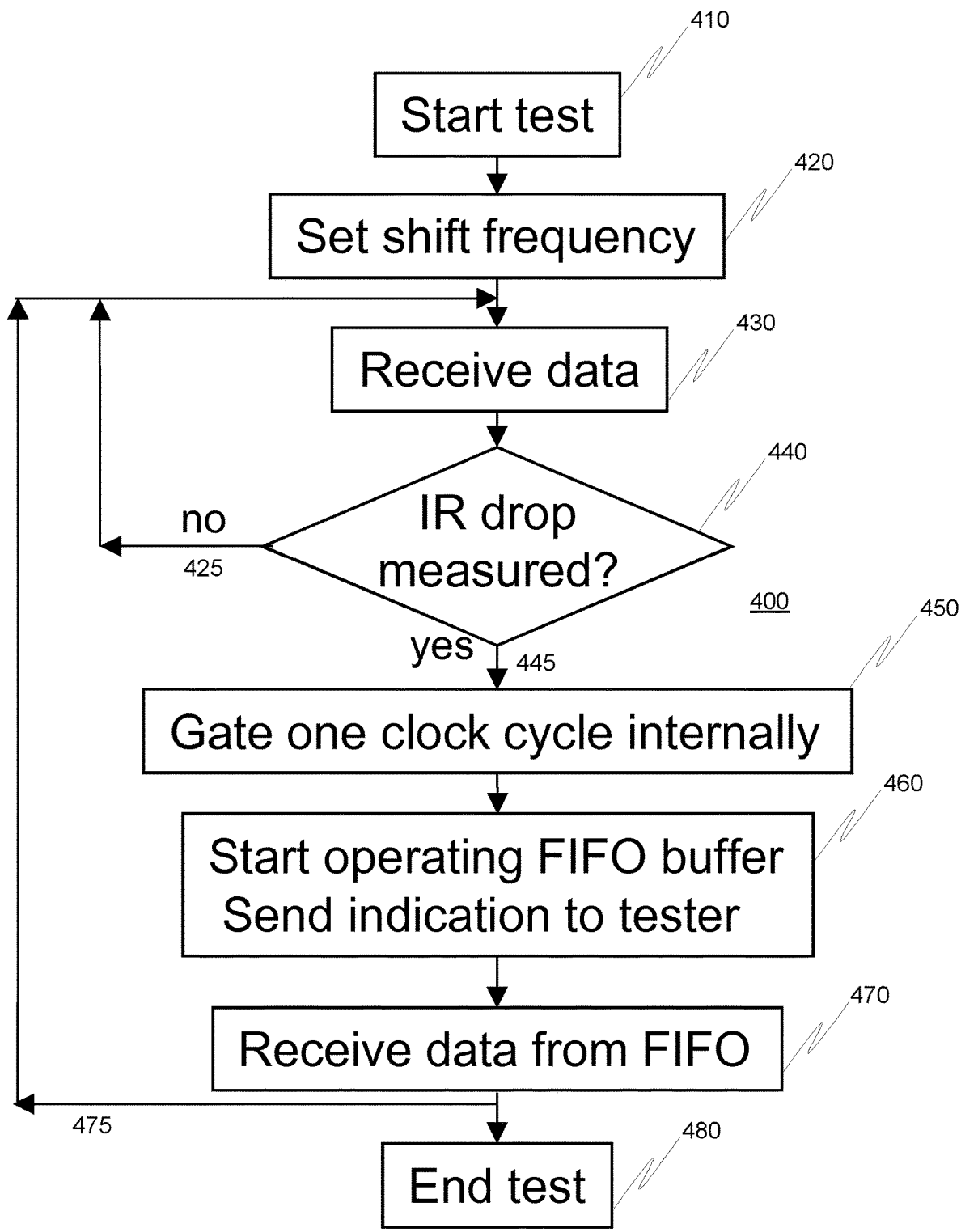
FIG. 4 shows a method of performing at-speed scan testing of an integrated circuit according to an example of the present invention.

FIG. 4 shows an example method 400 of performing at-speed testing of ICs using internal (to the integrated circuit) IR drop measurements in more detail.

The method starts at 410, after which a base shift load-in frequency is set 420 to a suitable value, which in the case of using this method (and associated apparatus) can be higher than is typically the case for the (relatively) "slow" load-in portion of the at-speed test methodology. Suitable load-in shift frequencies may be determined through an iterative test process, for example, by ramping up the load-in shift frequency each iteration and observing the resultant behaviour of the integrated circuit under test, or carrying out such iterations on a sample integrated circuit from the same or similar production batch, and then applying the frequency determined during the test iterations to other ICs in the manufacturing batch. For example, by using timing analysis of the proposed IC circuit design made during the design phase.

Once the load-in shift frequency is set 420, the actual load-in of the test data may occur, i.e. the data may be received 430 in suitable storage facilities within the integrated circuit under test, for example in test flip-flops, or other storage media within the integrated circuit.

As the load-in progresses, at each cycle of the integrated circuit test clock, the IR drop is measured 440, in this example by measuring the IR drop on the power supply to the integrated circuit, or portion thereof, such as scan chain portion, and the measured IR drop is compared against a predefined threshold value. If no IR drop is measured 425, or rather if the measured IR drop is maintained within the bounds of the predefined threshold, then the method is in a so called second state, and the next cycle of: data receipt/load-in 430 progresses as normal (and as before) and a further comparison occurs 440.

Whereas if an IR drop is detected that exceeds the predetermined threshold, indicating too much of an IR drop occurring in the integrated circuit under test during the load-in process, the method proceeds to be in a so called first state 445, and as a result the logic activity of the integrated circuit (or scan chain under test) is gated internally 450 to the integrated circuit/scan chain for one cycle. Other examples may gate for more than one cycle, and the invention is not so limited. The gating of the logic activity may for example comprise gating the normal clock signal and gating the logic signals propagation within the scan chain—the chain of flip-flops coupled to create the shift register used in at-speed scan testing, clocked with the shift clock signal.

To maintain the incoming test data integrity, i.e. to stop the test data being lost completely or loose synchronization whilst the logic activity is gated internally, the incoming test data may be stored in a buffer 460 (for example, a First In First Out, FIFO, memory buffer), and optionally, an indicator may be provided internally or externally to a test engineer, indicating the buffer 440 is in use.

Data may then be received by the scan chain under test from the memory buffer 470, but delayed by one cycle in comparison to the externally pushed data. It should be noted that internally the logic flow is not broken, because the entire integrated circuit is effectively exhibiting a long shift clock cycle in this situation.

The predefined threshold for the level of IR drop may be, for example, determined based upon statistical analysis of the integrated circuit (or sub-portion, such as logic cloud or scan chain) under test and/or a definition of a suitable level of IR drop that does not actually indicate any adverse effects on the integrated circuit during normal use parameters, as determined through testing of example real life ICs.

There now follows a description of a specific example integrated circuit.

Figure 5:
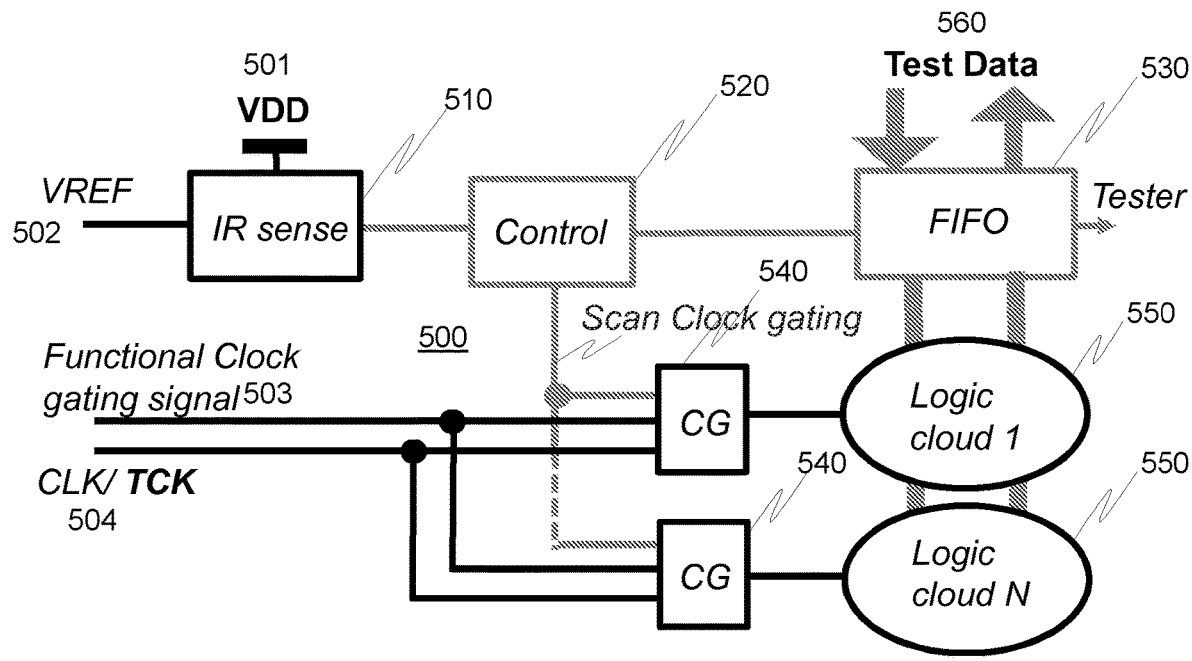
FIG. 5 shows an integrated circuit portion according to an example of the present invention.

FIG. 5 shows an example portion of an integrated circuit apparatus 500 arranged to implement the at-speed test optimization method described above. Only the gating signals are shown for clarity.

The integrated circuit 500 portion comprises an IR sense circuit block 510 operably coupled to the supply Voltage 501 (e.g. $V_{DD}$—which is also operably coupled to all other circuits/blocks within the integrated circuit, in order to power them, but this aspect is not shown to maintain the clarity of the figure) so that an integrated or operably coupled IR drop sensor can measure any IR drops occurring on the supply voltage 501, for comparison to a predetermined reference voltage, $V_{REF}$, 502.

The integrated circuit portion 500 further comprises a control logic block 520, arranged to control the gating of clock signals using clock gating circuits 540, dependent upon the output of the IR drop sense circuit 510. The control logic block 520 is also operably coupled to a memory buffer 530 (FIFO in this example), the memory buffer 530 being operable (under control of the control logic circuit 520, dependent on sensed IR drop) to buffer the incoming test data (the load-in data) and/or any resultant outgoing test data 560. The test data may be the data going to or coming from one or more logic clouds 550 within the integrated circuit under test, which is being tested in the at-sped scan test.

The logic clouds 550 may be conterminous with the scan chain(s) under test, or greater in scope that the scan chain(s) under test, for example the potential scan chain(s) under test may cross between the different logic clouds, or a logic cloud may include two or more chains. It is to be noted that the example in FIG. 5 is shown to be using a communal bus architecture to provide all the test data 560 to/from each/all logic clouds 550 to/from the memory buffer 530, but other suitable communications architectures may equally apply, for example, using dedicated communications lines between each individual logic cloud 550 and the memory buffer 530.

When an IR drop is developing on the supply voltage 501 below the predetermined voltage reference 502 occurs, the IR sense circuit 520 provides a suitable indicative signal to the control logic block 520, which in turn and dependent thereon controls a relevant scan clock gating signal for a relevant clock gating circuit 540 (where relevancy is, for example, dependent on which logic cloud is being tested at that time), to control the gating of the functional clock gating signal 503 and the input clock/test clock 504 towards the relevant logic cloud 550. The functional clock gating signal is an existing functionality to stop the clock during normal chip operation. The gating signal from the control logic 520 may gate the clock only when it is required according to the described method and the "final" gating of the clock may be an "OR" logic function between the two.

The memory buffer, e.g. FIFO, maximum width may typically be the test data bus size (for example 128 bit), and the memory buffer depth may vary from between scan chain length (e.g. 100-130 bits, optionally compressed) to only half of the scan chain length or even less, such as only being a word length in depth. The specific length of buffer used for a particular hardware implementation may depend on the design requirements/characteristics—i.e. the suitable memory buffer size and logical shape may be selected by the test engineer, and may depend on, for example, the projected test program scope, capability and the like.

Figure 6:
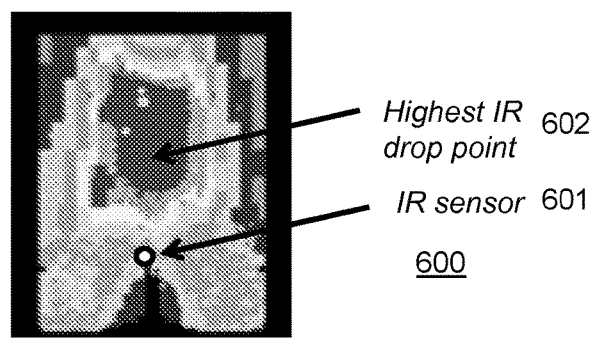
FIG. 6 shows a simulated IR drop map of a portion of an integrated circuit according to an example of the present invention.

FIG. 6 shows an example IR drop sensor placement adjacent a scan chain under test, and related simulated "heat" map of projected IR drop in an example test case, where the IR drop was measured to be over 90 mV. In this example, the IR sensor latency was less than 0.5 nsec, and used controllable pulse-width measurement. The invention is not limited by the type of IR drop sensor, other than by their respective latency and ability to output a different logic state according to predefined threshold values. For example, the maximum latency of the IR sensor may be dependent on the frequencies in use, such as the target scan load-in frequency and the like. For example, the latency selected for the IR drop sensor may be such that the selected latency of the IR drop sensor allows gating of the next shift if the IR drop has detected (i.e. it senses the IR drop quick enough to enact the mitigation technique of delaying the next cycle load-in), and so it will be appreciated that the latency will be a function of the characteristics of the particular integrated circuit under test, e.g. operating frequency and the like, and so the invention is not limited to a specific latency. Moreover, although the present example utilises a single threshold, other examples may include the use of multiple threshold values (and IR drop sensors arranged to be capable of using multiple thresholds), to capture a greater range of discrete IR drop situations.

Figure 7:
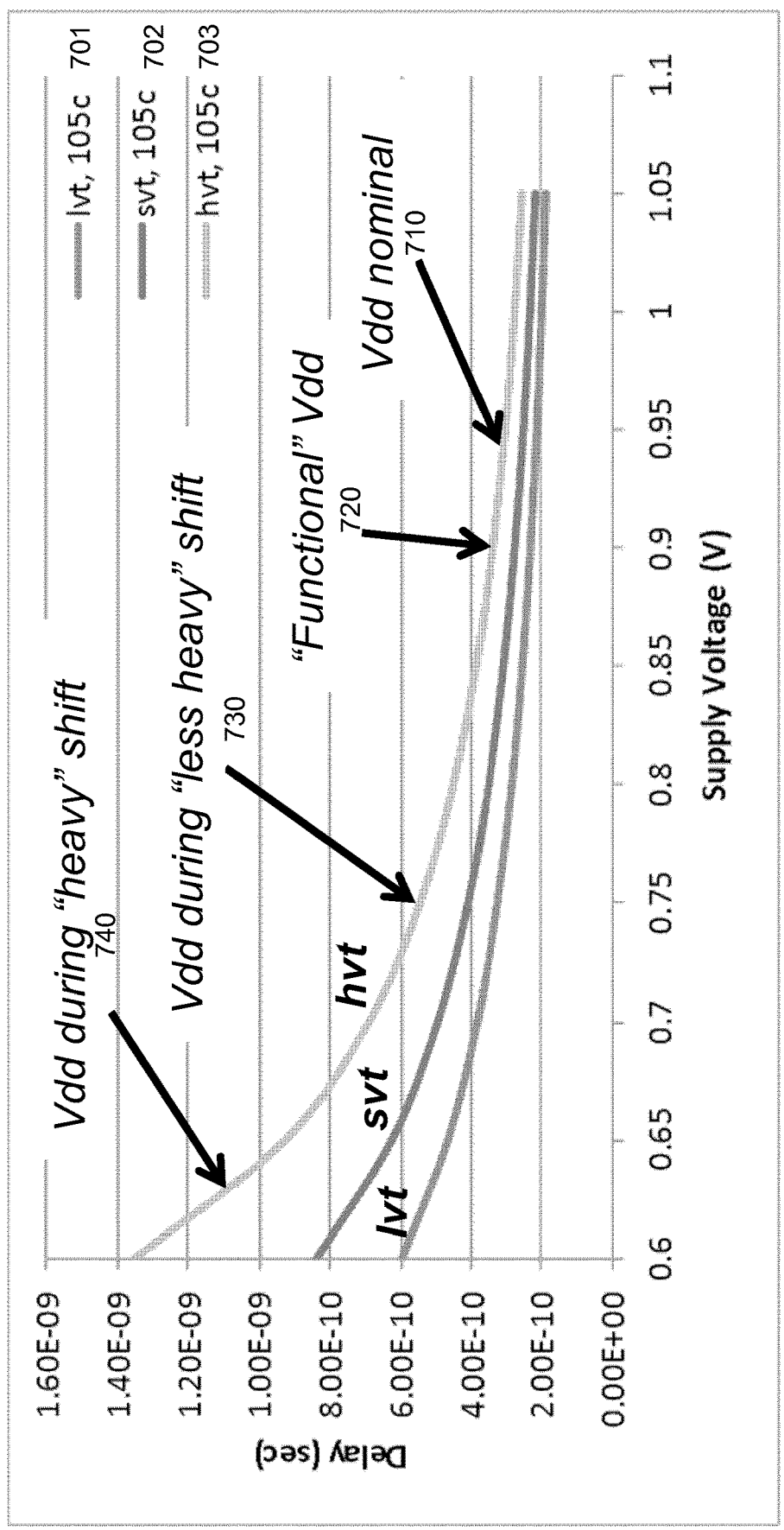
FIG. 7 is a set of graphs showing how delay varies according to supply voltage of an integrated circuit for three example types of transistor, manufactured using the same semiconductor process node.

FIG. 7 shows supply voltage of an integrated circuit (in Volts) vs delay caused by IR drop (in seconds), for three example types of transistor manufactured at the 28 nm process node, each at a junction temperature of 105° C. It can be seen that increasing voltage droops (i.e. higher IR drops—to the left of the graph) results in exponentially increasing integrated circuit propagation delay. Thus, path propagation delay within the relevant scan chain is exponentially proportional to the IR drop experienced therein, while the IR drop is directly proportional to the power consumption.

The graphs have data sets for exemplary low voltage threshold (lvt) devices 701, standard voltage threshold (svt) devices 702 and high voltage threshold (hvt) devices 703. The individual graphs (701-703) are shown to have different portions, i.e. sections of the curve, which are nominally defined as: at nominal supply voltage 710, at typical functional (i.e. expected normal operational levels considering functional IR drops) supply voltage 720; at "less heavy" load-in test data shift rate supply voltage 730 (i.e. fairly heavy integrated circuit transaction levels during the load-in, but not as high as it can be), and a final "heavy" load-in test data shift rate 740 (where the number of transactions in the load-in shift is, relatively, very high). It can be seen by comparing graphs of the different threshold types (low/standard/high) that whilst lowering the threshold voltage of the relevant transistors can decrease this delay growth, it can never be avoided. Hence the graphs in this figure show the benefits of applying the mitigation techniques described herein, in order to optimize at-speed test data load-in frequency.

Such statistical analysis of scan tests shows that an expected power consumption (and thus IR drop) difference of, for example, 30% may cause a path delay increase of about 150%. Thus, having for example 30% shift cycles with exaggerated power consumption (higher than the predetermined IR drop threshold) and 70% with moderate power consumption (i.e. below the predetermined IR drop threshold) may therefore allow the base load-in scan test shift frequency to be increased by up to 50%, thereby reducing the overall test time significantly and without getting false failures.

An example calculation of the total scan test time reduction possible, in an example based on the above percentages, is as follows:

$$\Delta T = 1 - ((0.3 * 2 + 0.7 * 1)/1.5) = 13\% \text{ (at least)}$$

The above equation shows that for the situation where a 30% period of relatively high power consumption cycles and 70% period of normal power consumption cycles occurs, then at least a 13% improvement may be provided (i.e. the 0.3 comes from 30%, 2 from the doubling of those cycle's effective length when method according to examples of the invention are applied, 0.7 from 70%, 1 from those cycles being the normal single cycle length, and 1.5 comes from the observable 150% delay if no mitigation were to be applied). Where, for example, the measured IR drop is such that multiple delayed cycles are imposed, then the cycle number value (2 in the equation above) would change accordingly.

In an example that tested integrated circuits manufactured at the 28 nm semiconductor manufacturing node, during the power consuming test (i.e. where there is a heavy shift, or at least relatively heavy shift, where heaviness of the shift is a measure of how much shifting occurs per unit time) it was shown that at least a part of the shift chain path may experience operations being performed at a voltage 150-300 mV lower than nominal due to the IR drop causes by the load-in. This level of IR drop may result in an increased propagation delay by the factor of 4-5 times.

Figure 8:
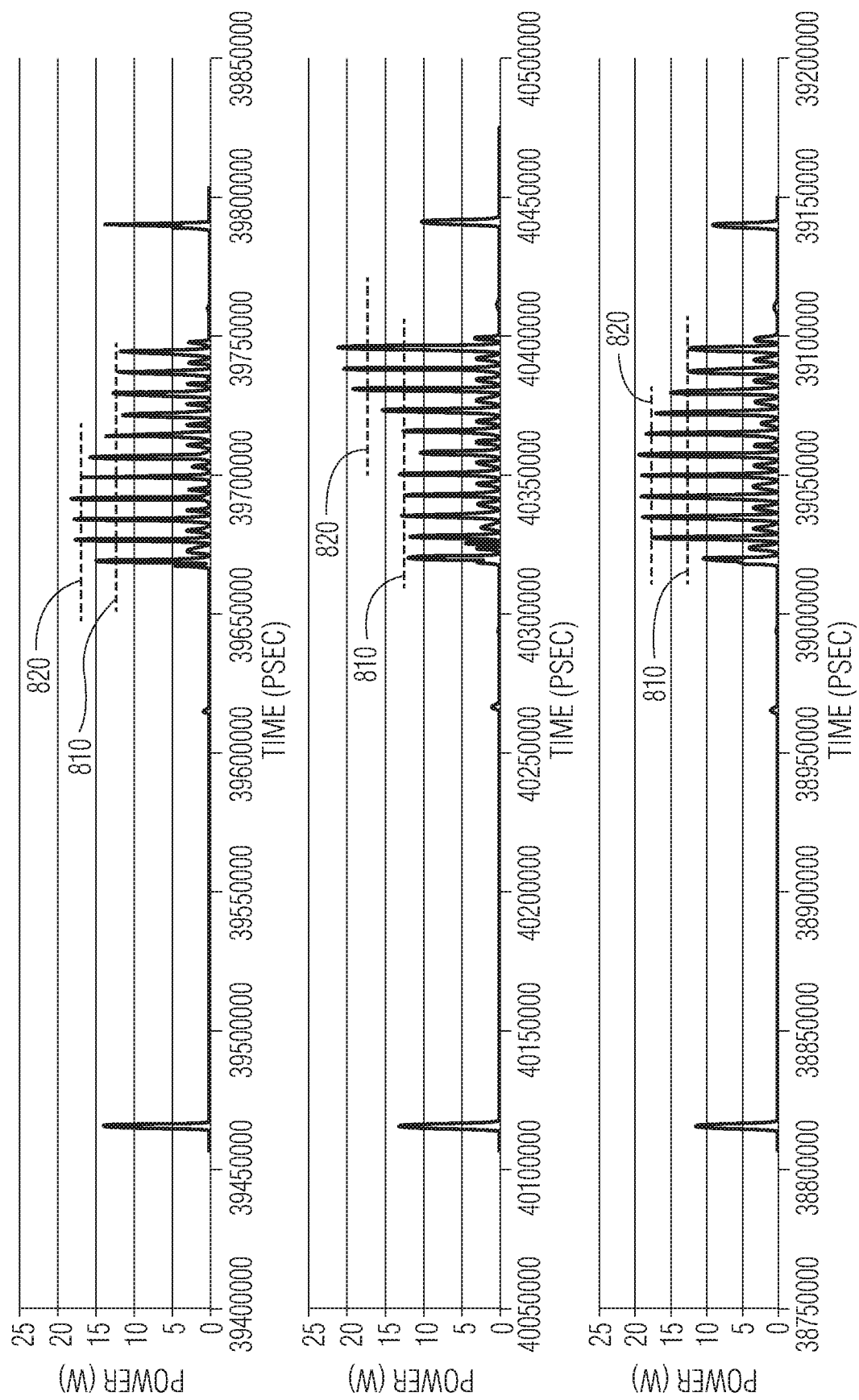
FIG. 8 shows three example power profiles of sample fragments of at-speed scan tests, and possible IS drop threshold values.

FIG. 8 shows three example power profiles of sample fragments of scan tests, during load-in, which show that there is no set point in time when the excessive load-in current draw will occur—it can happen at any time, and therefore a per cycle assessment allows the highest level of optimization available. Furthermore, the graphs shown in FIG. 8 are based on real test data, and show that the statistical assumptions about the power consumption distribution (e.g. the 70/30% share of normal vs heavily power consuming cycles) in the test discussed above with reference to FIG. 7 are reasonable.

These figures also show the application of potential suitable IR drop thresholds—with an excessive large power being directly related to a high IR drop, which is shown in the figures as the higher threshold 820. A lower power level, indicating a lesser IR drop, is shown by the lower threshold, 810.

The above described examples of the present invention provide a clear definition of the scan shift frequency (or shift-to-capture latency) based on power domain supply impedance, as measured by the IR drop experienced by the respective scan chain during load-in of the at-speed scan test data. This allows reduction of the test fall-out (i.e. false positive failures, and the like, which are not actually related to the real circuit malfunctioning, but rather are false failures due the load-in of the scan data itself), whilst increasing scan load-in frequency (and hence reducing test time). This is achieved by setting the effective shift cycle length for every single shift cycle dependent on measured IR drop in the proximity of the relevant circuit portion (e.g. scan chain) under test, by selectively gating the clocking signal. This influences the circuit maximal operating speed.

This is a particularly advantageous, more general solution, because typical power consumption of an integrated circuit during test varies during different shift cycle's test data and it would not be convenient or optimal to have to set the input frequency of entire pattern based on maximum potential power consumption over all cycles. Put another way, examples of the invention provide cycle by cycle adjustment, rather than using an overall reduced input frequency based on a single worst case situation. Moreover, internally gating a fixed (relatively high speed) clocking signal to provide the different effective frequencies is far simpler than to provide accurately tuned alternative frequencies, for example through use of a tuned Phase Locked Loop (PLL).

Moreover, examples of the invention do not require any adjustment to the test data scope (i.e. breadth of test), and therefore the test can maintain full coverage, thus providing a more complete test scope than would otherwise be the case in other mitigation techniques that effectively reduce scope of test to maintain low levels of false positive test results.

Examples of the invention provide an ability to distinguish between (relatively high) current consuming shift cycles and (relatively low) current consuming shift cycles during load-in of at speed test scan data. The single cycle resolution gating of the clocking signal dependent on this current consumption effectively enables an increase in the length of the (relatively high) current consuming cycles, to thereby mitigate the increased path delay (due to the extra IR drop caused by this (relatively high) current consumption). At the same time, it is possible to increase the "base" load-in shift frequency, such that the logic paths of the scan chain under test invoked in the (relatively) less current consuming shift cycles will not exhibit functional failure. This feature allows reduction of the test fall-out, whilst also improving (i.e. reducing) the aggregate test time.

In effect, the described method and associated apparatuses for at-speed scan test data load-in shift frequency optimization provide cycle-based (at single cycle resolution) shift frequency control of the load-in portion of at-speed scan test, that, for example, uses one or more IR sensors, preferably on-die and located in functional proximity to the respective portions of the overall integrated circuit under test, to distinguish (relatively higher) power consuming cycles from (relatively lower/none) non-power consuming cycles. The level of power consumption that determines whether a cycle is relatively higher or lower power consuming is dependent upon a comparison to one or more predefined threshold IR drop(s), where a particular IR drop is indicative of a particular power consumption level. Thus, examples of the invention can be modified to suit selected characteristic levels or bounds of power consumption.

Examples also provide an all-in-one-die solution transparent to test programs and engineers use thereof.

Further advantages of examples of the invention particularly include reduced false positive failures of integrated circuit's under test, i.e. where the failure is only due to IR drop caused by the load-in of the at-speed test data itself, and which would not happened in real life operation of the same integrated circuit, either with the test data whose load-in caused the false failure, or, indeed, real life operational data that is not specifically designed to put artificial strain on the integrated circuit (i.e. designed to maximise the number of transaction per unit time within the integrated circuit).

This is particularly advantageous, because load-in data IR drop related (i.e. false) failures are not usually consistent or easy to debug/assess for true relevance.

Another advantage of allowing ramp up of the baseline load-in frequency is that it provides a reduced overall test time. For example: a 10-15% reduction in scan test time could provide a 3-7% reduction in total product test time, assuming scan test time is 20-60% of the total test time, but the true figures will be completely dependent on the actual integrated circuit under test. Such a reduction in test time could result in reduced cost of development for the integrated circuit under test—for example, a saving of 1-3% (assuming test time cost is ½ to ¼ of the production cost).

The invention may also be implemented as a computer program for running on a computer system, at least including executable code portions for performing steps of any method according to embodiments of the invention when run on a programmable apparatus, such as a computer system or enabling a programmable apparatus to perform functions of a device or system according to embodiments the invention.

A computer program may be formed of a list of executable instructions such as a particular application program and/or an operating system. The computer program may for example include one or more of: a subroutine, a function, a procedure, an object method, an object implementation, an executable application, an applet, a servlet, a source code, an object code, a shared library/dynamic load library and/or other sequence of instructions designed for execution on a suitable computer system.

The computer program may be stored internally on a transitory or non-transitory computer readable storage medium or transmitted to the computer system via a computer readable transmission medium. All or some of the computer program may be provided on computer readable media permanently, removably or remotely coupled to the programmable apparatus, such as an information processing system. The computer readable media may include, for example and without limitation, any one or more of the following tangible non-transitory media: magnetic storage media including disk and tape storage media; optical storage media such as compact disk media (e.g., CD-ROM, CD-R, Blueray, etc.) digital video disk storage media (DVD, DVD-R, DVD-RW, etc) or high density optical media (e.g. Blu-eray, etc); non-volatile memory storage media including semiconductor-based memory units such as FLASH memory, EEPROM, EPROM, ROM; ferromagnetic digital memories; MRAM; volatile storage media including registers, buffers or caches, main memory, RAM, DRAM, DDR RAM etc. The computer readable media may also be data transmission media including computer networks, point-to-point telecommunication equipment, and carrier wave transmission media, and the like. Embodiments of the invention are not limited to the form of computer readable media used.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader scope of the invention as set forth in the appended claims.

For example, the semiconductor integrated circuits described herein may be formed from any suitable substrate, including suitable any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections allowing items to be operably coupled as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials may have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true ("high") or logically false ("low") state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device, i.e. on the same die. For example, in the form of a System on Chip device. Alternatively, the examples may be implemented as any number of separate integrated circuits or separate devices interconnected with each other in a suitable manner. For example, in the form of a System in Package device.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices such as Field Programmable Gate Arrays (FPGAs) or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Unless otherwise stated as incompatible, or the physics or otherwise of the embodiments prevent such a combination, the features of the following claims may be integrated together in any suitable and beneficial arrangement. This is to say that the combination of features is not limited by the specific form of claims below, particularly the form of the dependent claims, as such a selection may be driven by claim rule sin respective jurisdictions rather than actual intended physical limitation(s) on claim combinations.

The invention claimed is:

1. An integrated circuit, comprising:
   an integrated circuit power supply;
   at least one logic path, comprising a plurality of sequential logic elements operably coupled into a scan chain to form at least one scan chain under test;
   at least one IR drop sensor operably coupled to the integrated circuit power supply, operable to output a first logic state in response to a sensed supply voltage being below a first predefined value and to output a second logic state in response to the sensed supply voltage being above the first predefined value, wherein the first predefined value is determined based upon an IR drop indicative of a particular power consumption level during a shift load-in of a scan test data;
   at least one memory buffer operably coupled to a scan test data load-in input and a scan test data output of the at least one scan chain under test; and
   control logic operable to gate logic activity of a scan shift operation inside the integrated circuit for a single cycle in response to the at least one IR drop sensor outputs the first logic state, to store incoming data in the at least one memory buffer while the logic activity is gated for the scan shift operation during the single cycle, and to allow normal scan test flow in response to the at least one IR drop sensor outputs the second logic state.

2. The integrated circuit of claim 1, wherein the control logic is further operable to gate the logic activity within the at least one scan chain under test.

3. The integrated circuit of claim 1, wherein the IR drop sensor is located in proximity to the at least one scan chain under test or at a location with a highest expected IR drop during load-in of the scan test data into the integrated circuit.

4. The integrated circuit of claim 1, wherein the IR drop sensor is formed to have a latency value low enough to allow the IR drop sensor to sense an IR drop and provide a logic output in time for the gating of a next shift data load-in cycle decision.

5. The integrated circuit of claim 1, wherein the memory buffer is a First-In-First-Out buffer.

6. The integrated circuit of claim 1, wherein the memory buffer is at least one word depth.

7. The integrated circuit of claim 1, wherein the memory buffer has a depth equal to the test data bus width.

8. The integrated circuit of claim 1, wherein the memory buffer has a depth equal to at least half the length of a maximum intended length of scan chain, up to the maximum intended length of the scan test chain.

9. The integrated circuit of claim 1, wherein the memory buffer is operable to hold a next portion of the load-in data when the IR drop sensor outputs the first logic state and to immediately release the next portion of the load-in data in the next cycle when the IR drop sensor outputs the second logic state.

10. The integrated circuit of claim 1, wherein the memory buffer is further operable to hold a next portion of output test data when the IR drop sensor outputs the first logic state and to immediately release the next portion of the output test data in the next cycle when the IR drop sensor outputs the second logic state.

11. The integrated circuit of claim 1, wherein the control logic is further operable to provide an output signal indicative of an operational status of the memory buffer to indicate a current status of the at-speed test of the integrated circuit to a test engineer.

12. A method of performing at-speed scan testing of an integrated circuit, comprising:
   receiving test data at an input to at least one scan chain under test of an integrated circuit;
   measuring a supply voltage with at least one IR drop sensor coupled to the integrated circuit power supply whilst receiving the test data;
   outputting a first logic state when a sensed supply voltage is below a first predefined value and outputting a second logic state when the sensed supply voltage is above the first predefined value, wherein the first predefined value is determined based upon an IR drop indicative of a particular power consumption level during a shift load-in of a scan test data;
   gating logic activity including a scan shift operation inside the integrated circuit for a single cycle in response to the at least one IR drop sensor outputting the first logic state or allowing normal scan test flow in response to the at least one IR drop sensor outputting the second logic state;
   wherein if gating of logic activity occurs, the method further comprises:
   storing incoming test data in a memory buffer for at least one test shift cycle while the logic activity of the scan shift operation is gated.

13. The method of claim 12, further comprising receiving from the memory buffer the stored incoming test data delayed by at least one cycle at an input to at least one scan chain under test.

14. The method of claim 12, wherein gating logic activity further comprises gating the logic activity within the at least one scan chain under test.

15. The method of claim 12, further comprising providing the IR drop sensor at a location in proximity to the at least one scan chain under test or at a location with a highest expected IR drop during load-in of the scan test data into the integrated circuit.

16. The method of claim 12, further comprising storing output test data from the scan chain under test while storing incoming test data.

17. The method of claim 12, wherein storing incoming test data in a memory buffer for at least one test shift cycle comprises storing incoming test data for an integer multiple of a single test clock cycle.

18. The method of claim 12, further comprising outputting an output signal indicative of the memory buffer being in use.

* * * * *